US010861560B2

(12) United States Patent
Kodama

(10) Patent No.: US 10,861,560 B2
(45) Date of Patent: Dec. 8, 2020

(54) SEMICONDUCTOR MEMORY DEVICE

(71) Applicant: KIOXIA CORPORATION, Tokyo (JP)

(72) Inventor: Takuyo Kodama, Sagamihara Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/718,032

(22) Filed: Dec. 17, 2019

(65) Prior Publication Data

US 2020/0202949 A1    Jun. 25, 2020

(30) Foreign Application Priority Data

Dec. 25, 2018    (JP) .................................. 2018-241609

(51) Int. Cl.

| | |
|---|---|
| *G11C 16/24* | (2006.01) |
| *G11C 16/04* | (2006.01) |
| *G11C 16/26* | (2006.01) |
| *G11C 16/10* | (2006.01) |
| *G11C 16/14* | (2006.01) |
| *G11C 11/56* | (2006.01) |
| *G11C 16/30* | (2006.01) |
| *G11C 16/08* | (2006.01) |

(52) U.S. Cl.
CPC .......... *G11C 16/24* (2013.01); *G11C 11/5628* (2013.01); *G11C 11/5635* (2013.01); *G11C 11/5642* (2013.01); *G11C 11/5671* (2013.01); *G11C 16/0483* (2013.01); *G11C 16/10* (2013.01); *G11C 16/14* (2013.01); *G11C 16/26* (2013.01); *G11C 16/08* (2013.01); *G11C 16/30* (2013.01)

(58) Field of Classification Search
CPC ..... G11C 16/24; G11C 16/0483; G11C 16/26; G11C 16/10; G11C 16/14; G11C 11/5628; G11C 11/5635; G11C 11/5642; G11C 11/5671; G11C 16/30; G11C 16/08; G11C 16/32; G11C 2211/5621
USPC ..................................................... 365/185.23
See application file for complete search history.

(56) References Cited

U.S. PATENT DOCUMENTS

| | | | |
|---|---|---|---|
| 7,259,990 B2 | 8/2007 | Maejima et al. | |
| 7,869,295 B2* | 1/2011 | Cho ....................... | G11C 7/065 |
| | | | 365/210.12 |
| 8,830,760 B2 | 9/2014 | Funatsuki et al. | |
| 9,666,295 B2* | 5/2017 | Ma ......................... | G11C 16/28 |
| 2002/0031027 A1 | 3/2002 | Suematsu et al. | |

(Continued)

FOREIGN PATENT DOCUMENTS

| | | |
|---|---|---|
| JP | 2002074690 A | 3/2002 |
| JP | 4693375 B2 | 6/2011 |
| JP | 6039805 B2 | 12/2016 |

*Primary Examiner* — Fernando Hidalgo
(74) *Attorney, Agent, or Firm* — Holtz, Holtz & Volek PC

(57) ABSTRACT

According to one embodiment, a semiconductor memory device includes a first memory cell; a first word line coupled to the first memory cell; a first sense amplifier including a first transistor; a first bit line which couples the first memory cell to the first transistor; and a first driver configured to supply a first control signal to a gate of the first transistor. The first driver includes a first circuit configured to compare the first control signal and a second control signal to generate a third control signal based on a comparison result.

20 Claims, 10 Drawing Sheets

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2020/0082888 A1* | 3/2020 | Yanagidaira ...... H01L 27/11524 |

* cited by examiner

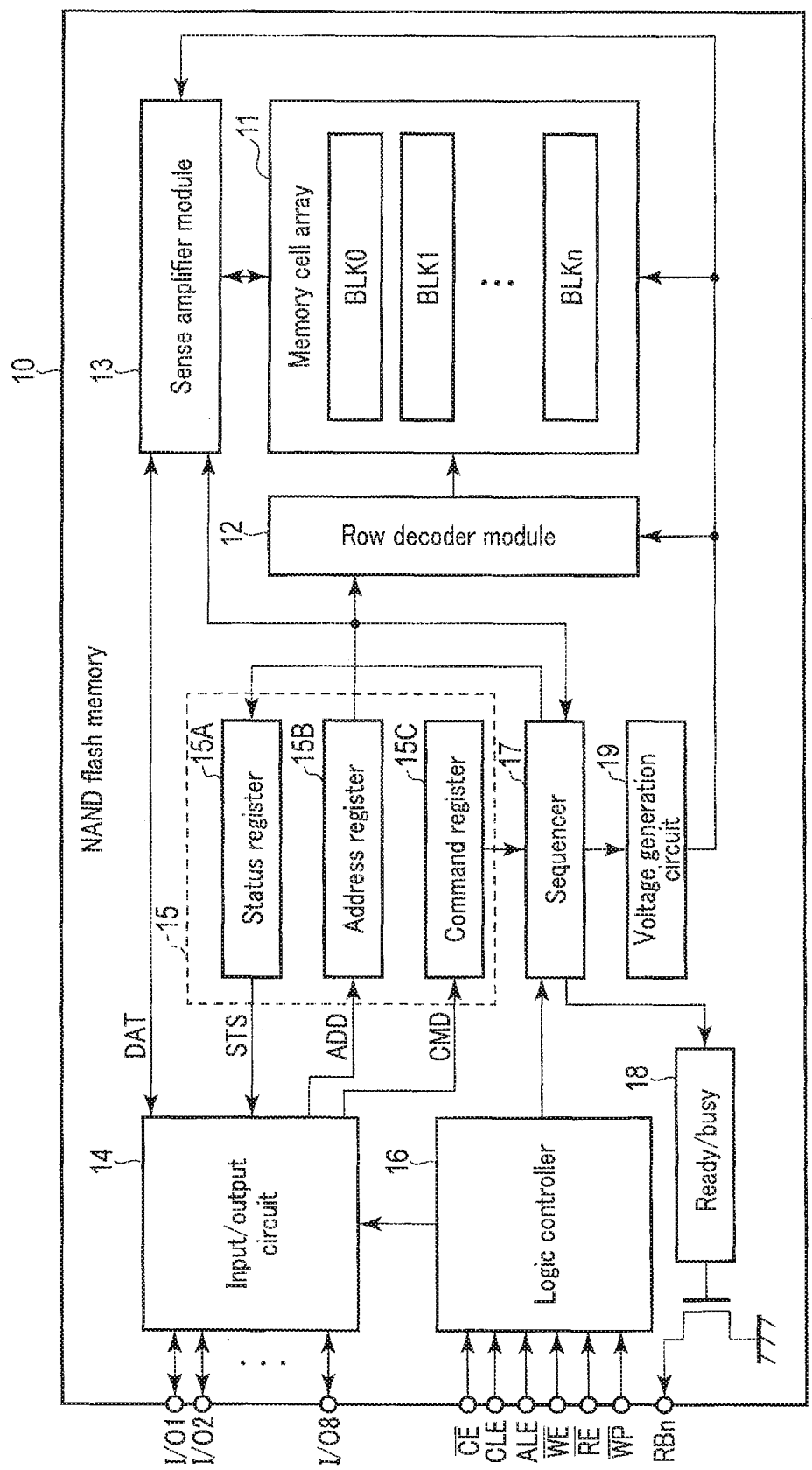
F I G. 1

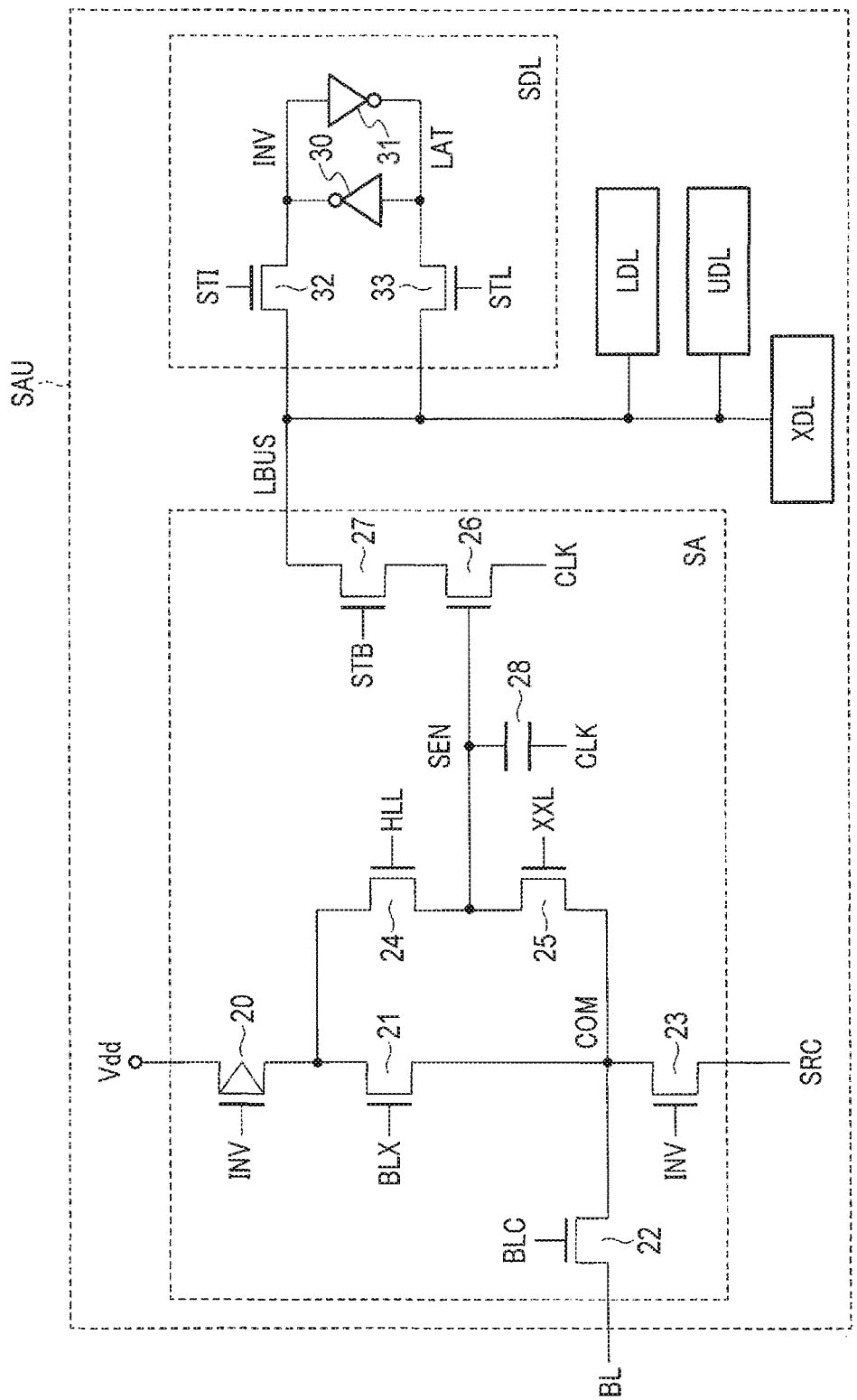
F I G. 5

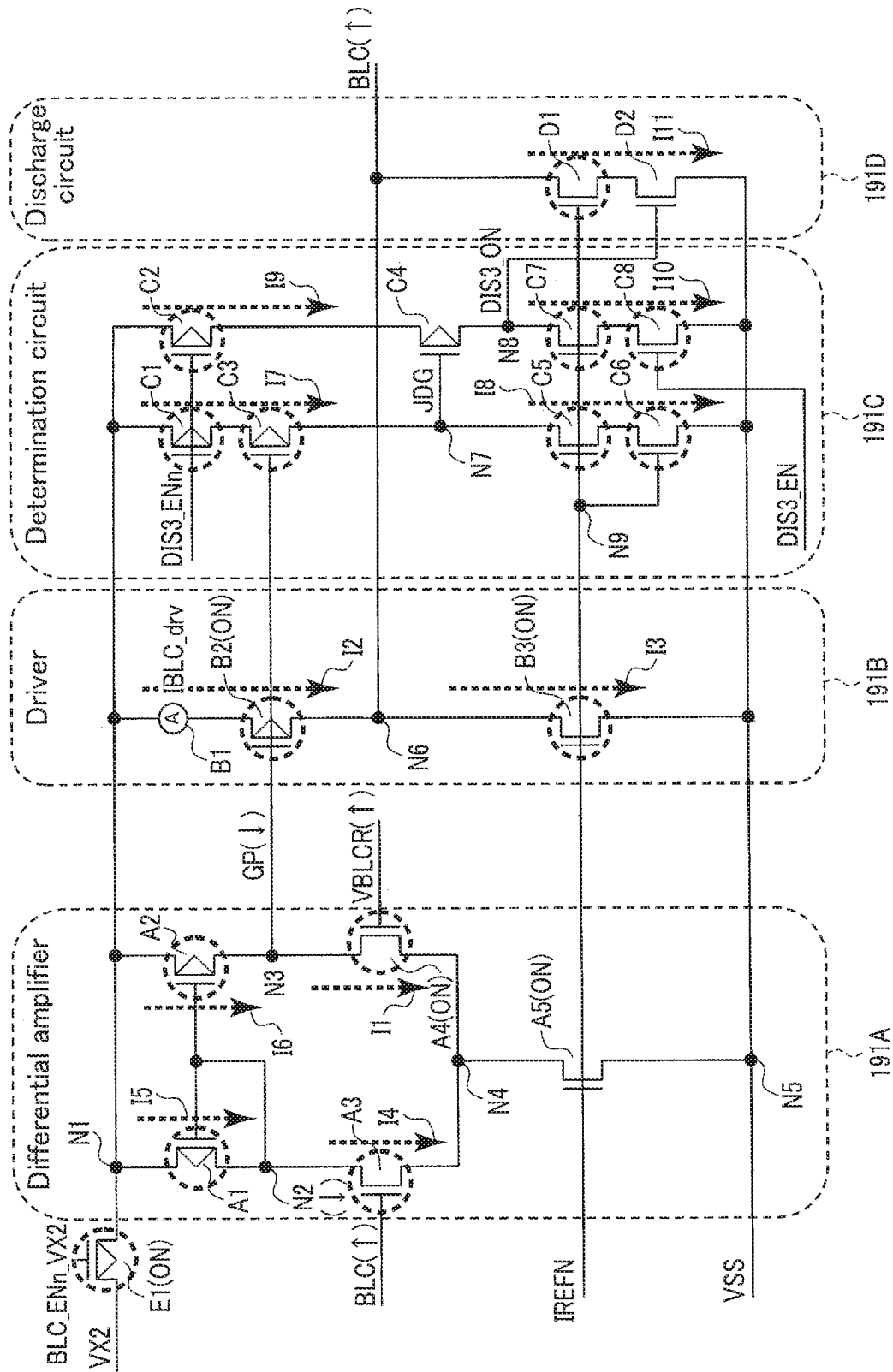
F I G. 8

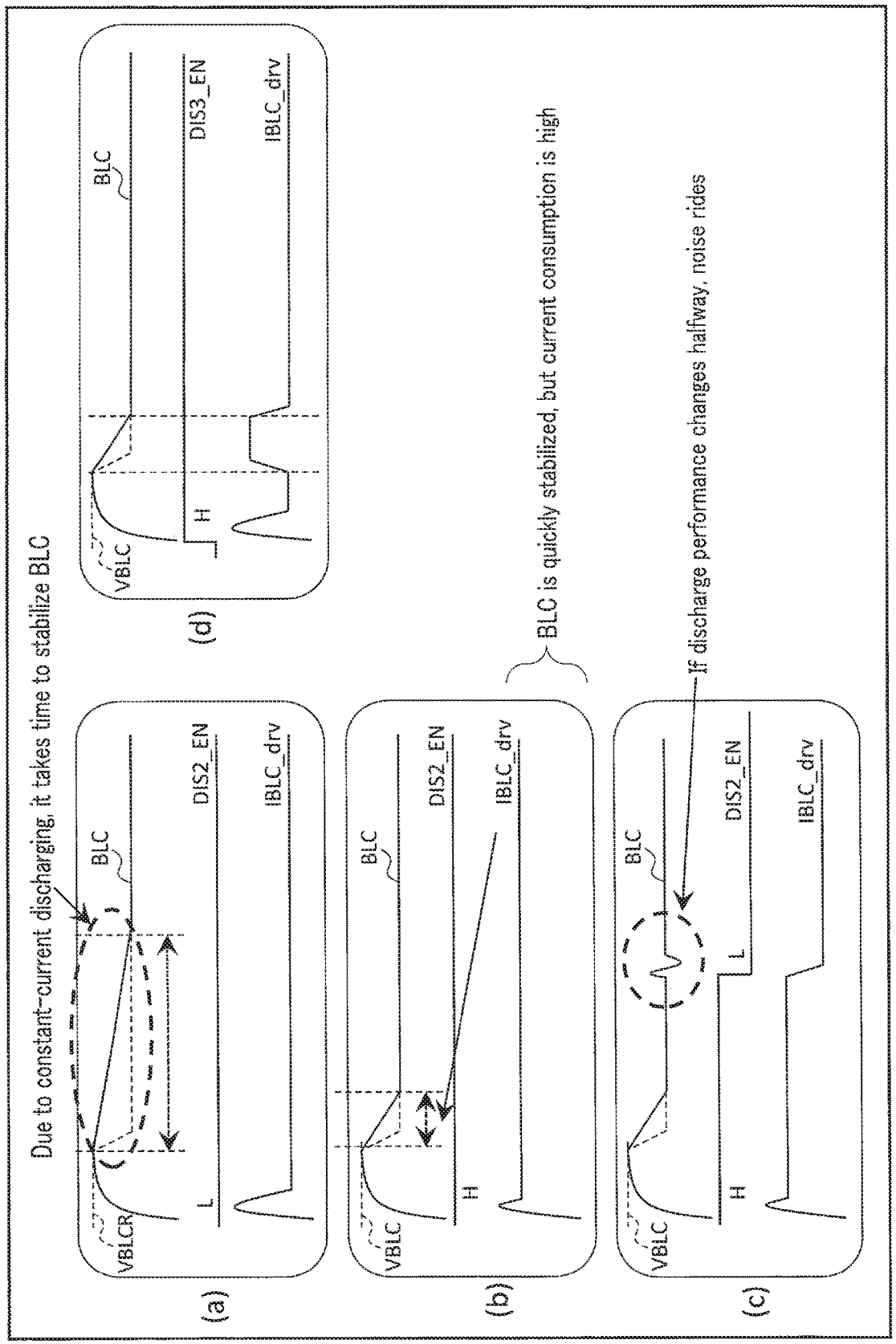
F I G. 10

SEMICONDUCTOR MEMORY DEVICE

CROSS-REFERENCE TO RELATED APPLICATIONS

This application is based upon and claims the benefit of priority from prior Japanese Patent Application No. 2018-241609, filed Dec. 25, 2018, the entire contents of which are incorporated herein by reference.

FIELD

An embodiment described herein relates to a semiconductor memory device.

BACKGROUND

A NAND flash memory in which memory cells are three-dimensionally arranged is known.

BRIEF DESCRIPTION OF THE DRAWINGS

FIG. 1 is a block diagram showing an example of the overall configuration of a semiconductor memory device.

FIG. 5 is a circuit diagram showing a configuration example of the sense amplifier module included in the semiconductor memory device.

FIG. 8 is a circuit diagram showing a configuration example of the BLC driver.

FIG. 10 is a waveform chart for explanation of the advantages of the embodiment.

DETAILED DESCRIPTION

Figure 2:
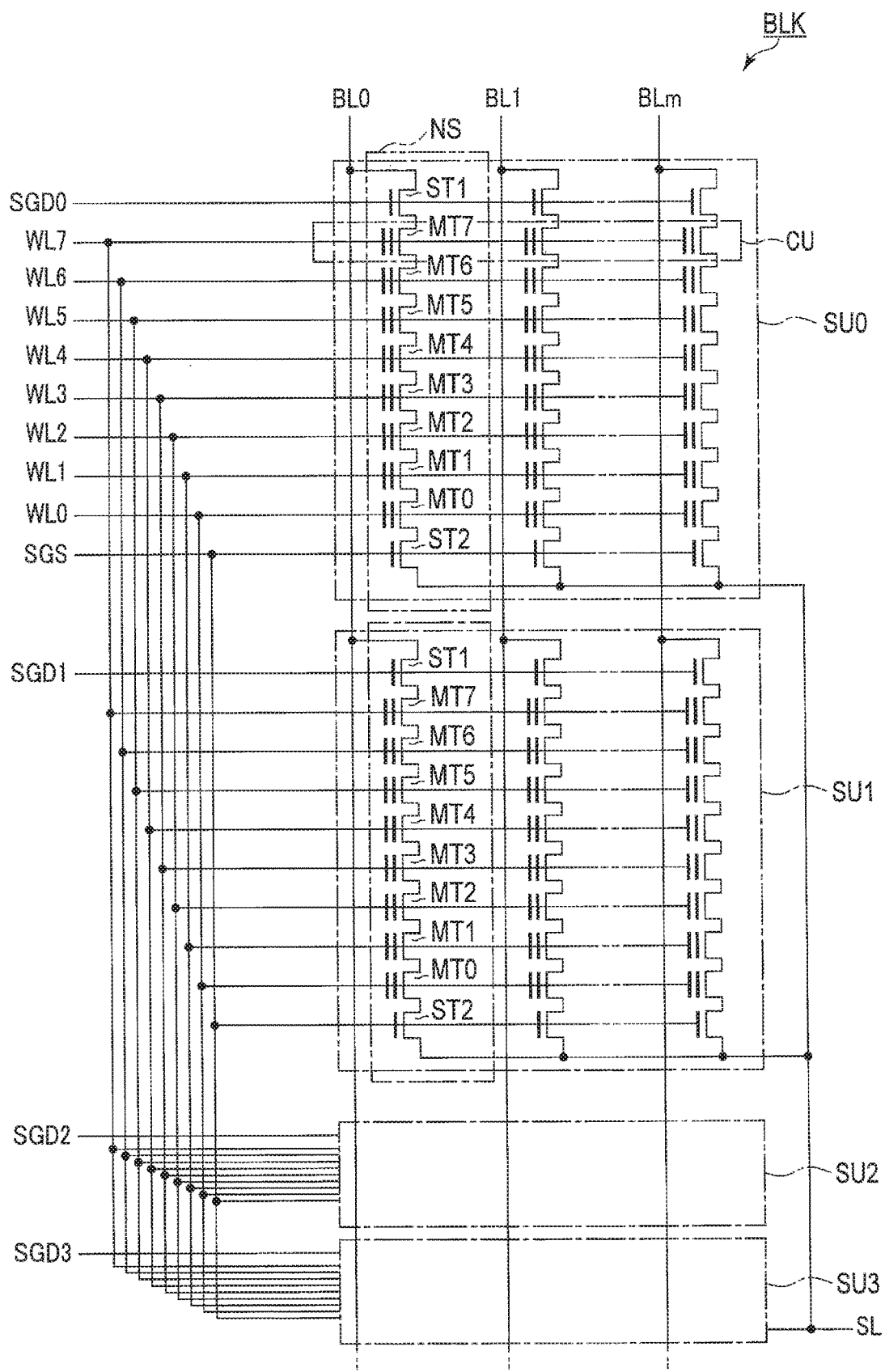
FIG. 2 is a circuit diagram showing a configuration example of a memory cell array included in the semiconductor memory device.

In generally, according to one embodiment, a semiconductor memory device includes a first memory cell; a first word line coupled to the first memory cell; a first sense amplifier including a first transistor; a first bit line which couples the first memory cell to the first transistor; and a first driver configured to supply a first control signal to a gate of the first transistor. The first driver includes: a first circuit configured to compare the first control signal and a second control signal to generate a third control signal based on a comparison result; a second circuit configured to charge and discharge a voltage of a first voltage output node at which the first control signal is generated, based on the third control signal; a third circuit configured to generate a fourth control signal indicating whether or not to discharge the voltage of the first voltage output node based on the third control signal; and a fourth circuit configured to discharge the voltage of the first voltage output node based on the fourth control signal. In a first period to allow the first sense amplifier to determine data stored in the first memory cell while a read voltage is applied to the first word line during a read operation, the first driver brings a voltage of the first control signal from a first voltage to a second voltage which is higher than the first voltage, and then from the second voltage to a third voltage which is lower than the second voltage.

Hereinafter, an embodiment will be described with reference to the drawings. The drawings are schematic. In the following description, structural elements having substantially the same function and configuration will be assigned with the same reference numeral. The numeral following a letter constituting a reference numeral/symbol and the letter following a numeral constituting a reference numeral/symbol are used for distinction between elements referred to by reference numerals/symbols including the same letter or numeral and having the same configuration. If elements represented by reference symbols/numerals including the same letter or numeral need not be distinguished, those elements are assigned with reference symbols/numerals including only the same letter or numeral.

[1] Embodiment

Hereinafter, a semiconductor memory device according to an embodiment will be described.

[1-1] Configuration

[1-1-1] Overall Configuration of Semiconductor Memory Device 10

FIG. 1 is a block diagram showing an example of the overall configuration of a semiconductor memory device 10 according to the embodiment. As shown in FIG. 1, the semiconductor memory device 10 includes a memory cell array 11, a row decoder module 12, a sense amplifier module 13, an input/output circuit 14, a register 15, a logic controller 16, a sequencer 17, a ready/busy control circuit 18, and a voltage generation circuit 19.

The memory cell array 11 includes blocks BLK0 to BLKn (n is a natural number not less than 1). The block BLK is a set of a plurality of nonvolatile memory cells, each of which is associated with a bit line and a word line, and corresponds to a data erase unit, for example. The semiconductor memory device 10 adopts, for example, the multi-level cell (MLC) method so that two or more-bit data can be stored in each memory cell.

The row decoder module 12 can select a target block BLK, on which various operations are executed, based on a block address held in an address register 15B. The row decoder module 12 can transfer a voltage supplied from the voltage generation circuit 19 to the selected block BLK. The details of the row decoder module 12 will be described later.

The sense amplifier module 13 can output data DAT read from the memory cell array 11 to an external controller via the input/output circuit 14. The sense amplifier module 13 can also transfer write data DAT received from the external controller via the input/output circuit 14 to the memory cell array 11.

The input/output circuit 14 can transmit, for example, 8-bit wide input/output signals I/O (I/O1 to I/O8) to the external controller, and receive them therefrom. For example, the input/output circuit 14 transfers write data DAT included in an input/output signal I/O received from the external controller to the sense amplifier module 13, and transmits read data DAT transferred from the sense amplifier module 13 to the external controller as an input/output signal I/O.

The register 15 includes a status register 15A, an address register 15B, and a command register 15C. The status register 15A holds, for example, status information STS of the sequencer 17, and transfers this status information STS to the input/output circuit 14 based on an instruction of the sequencer 17. The address register 15B holds address information ADD transferred from the input/output circuit 14. The block address, column address, and page address included in the address information ADD are used in the row decoder module 12, sense amplifier module 13, and voltage generation circuit 19, respectively. The command register 15C holds a command CMD transferred from the input/output circuit 14.

The logic controller 16 can control the input/output circuit 14 and the sequencer 17 based on various control signals received from the external controller. Various control signals include, for example, a chip enable signal /CE, a command latch enable signal CLE, an address latch enable signal ALE, a write enable signal /WE, a read enable signal /RE, and a write protect signal /WP. The signal /CE is a signal for enabling the semiconductor memory device 10. The signal CLE is a signal for notifying the input/output circuit 14 that the signal input to the semiconductor memory device 10 in parallel with the asserted signal CLE is a command CMD. The signal ALE is a signal for notifying the input/output circuit 14 that the signal input to the semiconductor memory device 10 in parallel with the asserted signal ALE is address information ADD. The signals /WE and /RE are, for example, a signal for instructing the input/output circuit 14 to input or output an input/output signal I/O. The signal /WP is, for example, a signal for placing the semiconductor memory device 10 in a protected state when turning on or off the power.

The sequencer 17 can control the overall operation of the semiconductor memory device 10 based on the command CMD held in the command register 15C. For example, the sequencer 17 controls the row decoder module 12, the sense amplifier module 13, the voltage generation circuit 19, etc. to execute various operations such as a write operation and a read operation.

The ready/busy control circuit 18 can generate a ready/busy signal RBn based on the operation state of the sequencer 17. The signal RBn is a signal for notifying the external controller of whether the semiconductor memory device 10 is in a ready state in which the semiconductor memory device 10 accepts an instruction from the external controller or in a busy state in which the semiconductor memory device 10 does not accept the instruction.

The voltage generation circuit 19 can generate a desired voltage based on control by the sequencer 17, and supply the generated voltage to, for example, the memory cell array 11, the row decoder module 12, or the sense amplifier module 13. For example, the voltage generation circuit 19 applies a desired voltage to each of the signal line corresponding to the selected word line and the signal line corresponding to the unselected word line based on the page address held in the address register 15B.

[1-1-2] Configuration of Memory Cell Array 11

FIG. 2 is a circuit diagram showing a configuration example of the memory cell array 11 included in the semiconductor memory device 10 according to the embodiment, and shows an example of the detailed circuit configuration of one block BLK in the memory cell array 11. As shown in FIG. 2, the block BLK includes, for example, string units SU0 to SU3.

Each string unit SU includes a plurality of NAND strings NS associated with bit lines BL0 to BLm (m is a natural number not less than 1), respectively. Each NAND string NS includes, for example, memory cell transistors MT0 to MT7 and select transistors ST1 and ST2.

The memory cell transistor MT includes a control gate and a charge storage layer, and can nonvolatilely store data. The memory cell transistors MT0 to MT7 included in each NAND string NS are coupled in series between the source of the select transistor ST1 and the drain of the select transistor ST2. The control gates of the memory cell transistors MT0 to MT7 included in the same block BLK are coupled in common to respective word lines WL0 to WL7. Hereinafter, a plurality of memory cell transistors MT of each string unit SU coupled to a common word line WL are called a "cell unit CU". When each memory cell transistor MT in the cell unit CU stores 1-bit data, the cell unit CU stores 1-page data, whereas when each memory cell transistor MT in the cell unit CU stores 2-bit data, the cell unit CU stores 2-page data.

The select transistors ST1 and ST2 are used to select a string unit SU in various operations. The drains of the select transistors ST1 included in the NAND strings NS corresponding to the same column address are coupled in common to a corresponding bit line BL. The gates of the select transistors ST1 in the string units SU0 to SU3 are coupled in common to respective select gate lines SGD0 to SGD3. The sources of the select transistors ST2 in the same block BLK are coupled in common to a source line SL, and the gates of the select transistors ST2 in the same block BLK are coupled in common to a select gate line SGS.

In the above-described circuit configuration of the memory cell array 11, the word lines WL0 to WL7 are provided for each block BLK. The bit lines BL0 to BLm are shared by a plurality of blocks BLK. The source line SL is shared by a plurality of blocks BLK. The number of string units SU included in each block BLK and the number of each of the memory cell transistors MT and select transistors ST1 and ST2 included in each NAND string NS are mere examples, and may be any number. The number of each of the word lines WL and the select gate lines SGD and SGS are changed based on the number of each of the memory cell transistors MT and the select transistors ST1 and ST2.

Figure 3:
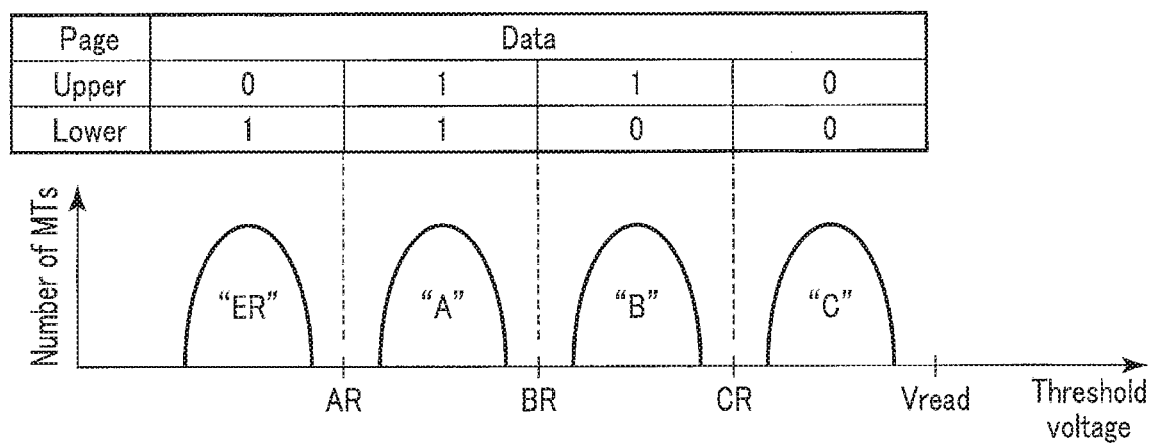
FIG. 3 is a diagram showing an example of threshold distribution and data allocation of memory cell transistors included in the semiconductor memory device.

In the above-described circuit configuration of the memory cell array 11, the threshold distribution of the threshold voltages of a plurality of memory cell transistors MT coupled to a common word line WL in one string unit SU is, for example, as shown in FIG. 3. FIG. 3 shows an example of threshold distribution, read voltages, and data allocation of the case where a single memory cell transistor MT stores 2-bit data, in which the vertical axis corresponds to the number of memory cell transistors MT, and the horizontal axis corresponds to the threshold voltages Vth of the memory cell transistors MT.

As shown in FIG. 3, the memory cell transistors MT belong to four threshold distribution areas depending on the 2-bit data stored therein. The four threshold distribution areas are called an "ER" level, "A" level, "B" level, and "C" level in the ascending order of the threshold voltage. In the MLC method, for example, "10 (lower, upper) data", "11" data, "01" data, and "00" data are allocated to the "ER" level, "A" level, "B" level, and "C" level, respectively.

In the above-described threshold distribution, a read voltage is set between adjacent threshold distribution areas. For example, a read voltage AR is set between the maximum threshold voltage of the "ER" level and the minimum threshold voltage of the "A" level, and is used for an operation to determine whether the threshold voltage of a memory cell transistor MT is included in the "ER"-level threshold distribution area or in the "A"-level threshold distribution area. The other read voltages BR and CR are set in a similar manner to the read voltage AR. A read pass voltage Vread is set at a voltage higher than the maximum threshold voltage of the highest threshold distribution area. The memory cell transistor MT with a gate to which the read pass voltage Vread is applied is turned on regardless of data stored therein.

The above-described bit number of data stored in a single memory cell transistor MT and data allocation to the threshold distribution areas of memory cell transistors MT are mere examples, and the bit number and data allocation are not limited thereto. For example, a single memory cell transistor MT may store 1-bit or 3 or more-bit data, and various data allocation other than the above may be applied to the threshold distribution areas.

[1-1-3] Configuration of Sense Amplifier Module 13 and Voltage Generation Circuit 19

Figure 4:
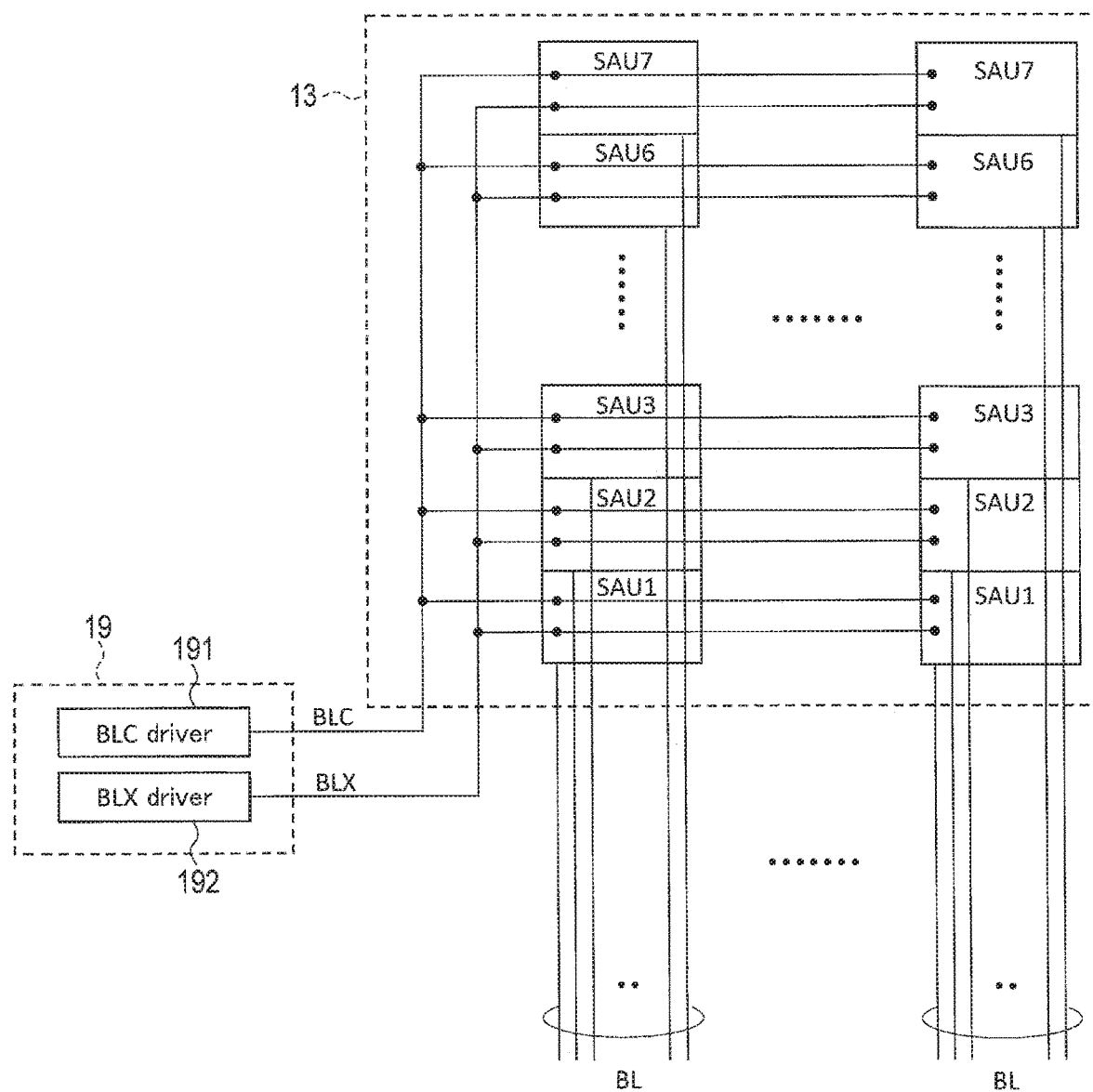
FIG. 4 is a block diagram showing a detailed configuration example of a sense amplifier module and voltage generation circuit included in the semiconductor memory device.

FIG. 4 is a block diagram showing a detailed configuration example of the sense amplifier module 13 and voltage generation circuit 19 included in the semiconductor memory device 10 according to the embodiment.

The sense amplifier module 13 includes sense amplifier units SAU0 to SAU7 aligned, for example, in the extending direction of the bit lines BL. Each sense amplifier unit SAU is coupled to a single bit line BL. Namely, the number of the sense amplifier units SAU included in the sense amplifier module 13 corresponds to, for example, the number of bit lines BL.

For example, in a read operation, the sense amplifier unit SAU reads data of the memory cells in a selected block.

The voltage generation circuit 19 includes a BLC driver 191 and a BLX driver 192.

The BLC driver 191 generates a control signal BLC based on a voltage generated by a charge pump (not shown). Then, the BLC driver 191 supplies the generated control signal BLC to the sense amplifier unit SAU.

The BLX driver 192 generates a control signal BLX based on the voltage generated by the charge pump (not shown). Then, the BLX driver 192 supplies the generated control signal BLX to the sense amplifier unit SAU.

The above-described detailed circuit configuration of each sense amplifier unit SAU is, for example, as shown in FIG. 5. FIG. 5 shows an example of the detailed circuit configuration of one sense amplifier unit SAU in the sense amplifier module 13. As shown in FIG. 5, the sense amplifier unit SAU includes a sense amplifier SA and latch circuits SDL, LDL, UDL, and XDL, which are coupled to one another so that data can be transmitted and received therebetween.

For example, in a read operation, the sense amplifier SA senses data read out to the corresponding bit line BL, and determines whether the read data is "0" or "1". As shown in FIG. 5, the sense amplifier SA includes a PMOS transistor 20, NMOS transistors 21 to 27, and a capacitor 28.

One end of the transistor 20 is coupled to a power line, and the gate of the transistor 20 is coupled to a node INV. One end of the transistor 21 is coupled to the other end of the transistor 20, the other end of the transistor 21 is coupled to a node COM, and the control signal BLX is input to the gate of the transistor 21. One end of the transistor 22 is coupled to the node COM, the other end of the transistor 22 is coupled to the corresponding bit line BL, and the control signal BLC is input to the gate of the transistor 22. One end of the transistor 23 is coupled to the node COM, the other end of the transistor 23 is coupled to a node SRC, and the gate of the transistor 23 is coupled to a node INV. One end of the transistor 24 is coupled to the other end of the transistor 20, the other end of the transistor 24 is coupled to a node SEN, and a control signal HLL is input to the gate of the transistor 24. One end of the transistor 25 is coupled to the node SEN, the other end of the transistor 25 is coupled to the node COM, and a control signal XXL is input to the gate of the transistor 25. A clock CLK is input to one end of the transistor 26, and the gate of the transistor 26 is coupled to the node SEN. One end of the transistor 27 is coupled to the other end of the transistor 26, the other end of the transistor 27 is coupled to a bus LBUS, and a control signal STB is input to the gate of the transistor 27. One end of the capacitor 28 is coupled to the node SEN, and the clock CLK is input to the other end of the capacitor 28.

The latch circuits SDL, LDL, UDL, and XDL can temporarily hold read data, and the latch circuit XDL is coupled to the input/output circuit 14 and used for data input/output between the sense amplifier unit SAU and the input/output circuit 14. As shown in FIG. 5, the latch circuit SDL includes inverters 30 and 31 and NMOS transistors 32 and 33.

The inverter 30 has an input terminal coupled to a node LAT, and an output terminal coupled to a node INV. The inverter 31 has an input terminal coupled to the node INV, and an output terminal coupled to the node LAT. One end of the transistor 32 is coupled to the node INV, the other end of the transistor 32 is coupled to the bus LBUS, and a control signal STI is input to the gate of the transistor 32. One end of the transistor 33 is coupled to the node LAT, the other end of the transistor 33 is coupled to the bus LBUS, and a control signal STL is input to the gate of the transistor 33. The circuit configurations of the latch circuits LDL, UDL, and XDL are, for example, the same as that of the latch circuit SDL, and descriptions thereof are omitted.

In the above-described configuration of the sense amplifier unit SAU, for example, a voltage Vdd, which is the source voltage of the semiconductor memory device 10, is applied to the source line coupled to one end of the transistor 20 and, for example, a voltage Vss, which is the ground voltage of the semiconductor memory device 10, is applied to the node SRC. The various control signals described above are generated by, for example, the sequencer 17.

The configuration of the sense amplifier module 13 in the embodiment is not limited to this. For example, the number of latch circuits included in the sense amplifier unit SAU may be any number. In this case, the number of latch circuits is designed based on, for example, the bit number of data held by a single memory cell transistor MT. Described above as an example is the case where the sense amplifier unit SAU is in one-to-one correspondence with the bit line BL; however, the configuration is not limited to this. For example, a plurality of bit lines BL may be coupled to a single sense amplifier unit SAU via a selector.

Figure 6:
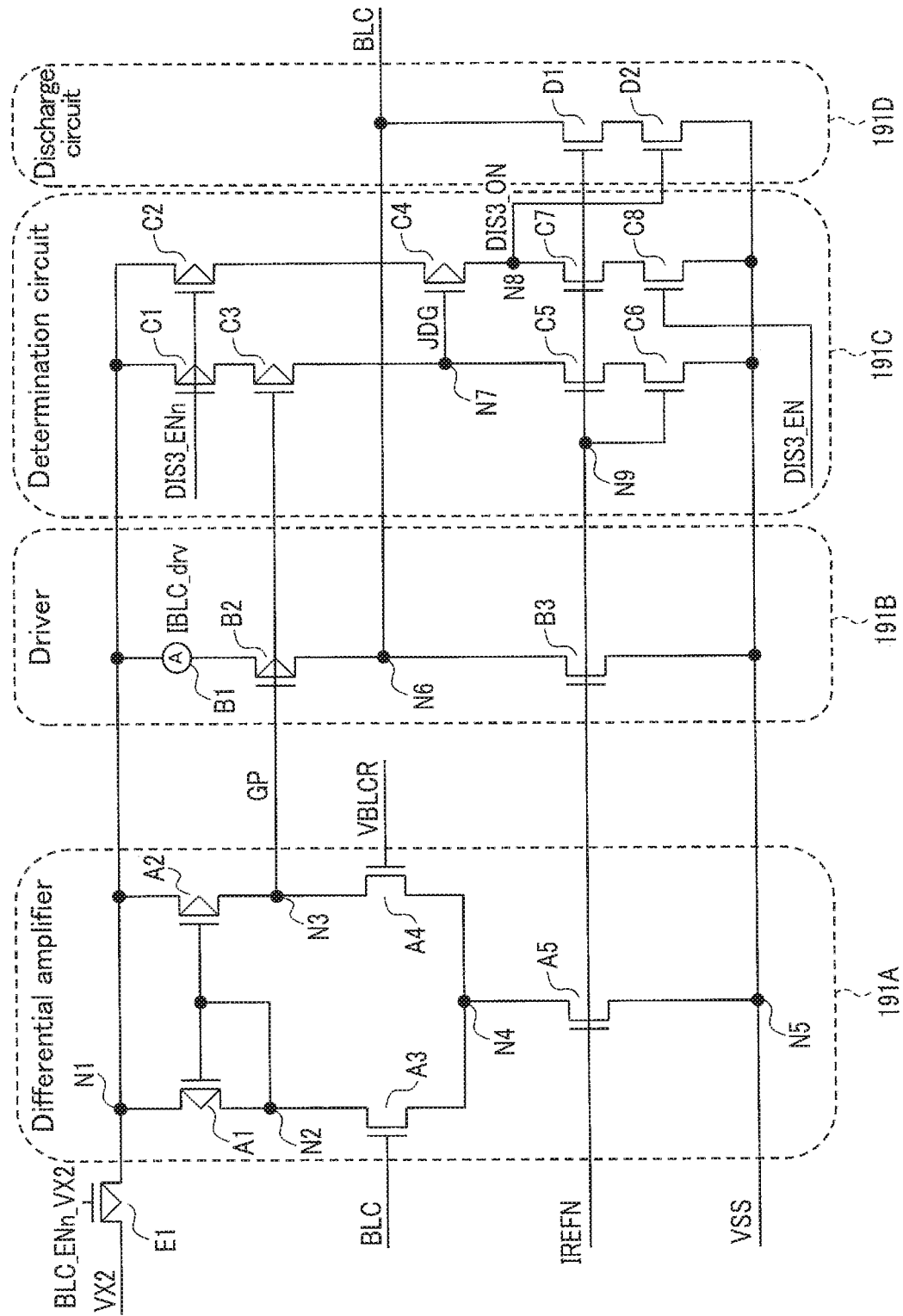
FIG. 6 is a diagram showing a configuration example of a BLC driver.

The above-described detailed circuit configuration of the BLC driver 191 is, for example, as shown in FIG. 6. FIG. 6 shows an example of the detailed configuration of the BLC driver 191. As shown in FIG. 6, the BLC driver 191 roughly includes a differential amplifier 191A, a driver 191B, a determination circuit 191C, a discharge circuit 191D, and a PMOS transistor E1.

The differential amplifier 191A compares a control signal VBLCR and the control signal BLC. The driver 191B charges and discharges the node of the control signal BLC based on the comparison result of the differential amplifier 191A. The determination circuit 191C evaluates the comparison result of the differential amplifier 191A. When the determination circuit 191C determines that the node should be discharged, the determination circuit 191C transmits the determination result to the discharge circuit 191D. The discharge circuit 191D discharges the node of the control signal BLC based on the determination result of the determination circuit 191C. The transistor E1 supplies a voltage to the differential amplifier 191A, the driver 191B, and the determination circuit 191C.

Hereinafter, specific circuit configurations of the differential amplifier 191A, the driver 191B, the determination circuit 191C, and the discharge circuit 191D will be described.

The differential amplifier 191A includes PMOS transistors A1 and A2, and NMOS transistors A3, A4, and A5.

One end of the transistor A1 is coupled to a node N1 to which a voltage VX2 is supplied from the transistor E1, and the other end and the gate of the transistor A1 are coupled to a node N2. Namely, the transistor A1 transfers a voltage from the node N1 to the node N2 in accordance with the node N2.

One end of the transistor A2 is coupled to the node N1, the other end of the transistor A2 is coupled to a node N3 (also referred to as a node GP), and the gate of the transistor A2 is coupled to the node N2. Namely, the transistor A2 transfers a voltage from the node N1 to the node N3 in accordance with the node N2.

One end of the transistor A3 is coupled to the node N2, the other end of the transistor A3 is coupled to a node N4, and the control signal BLC is input to the gate of the transistor A3. Namely, the transistor A3 transfers a voltage from the node N2 to the node N4 in accordance with the control signal BLC.

One end of the transistor A4 is coupled to the node N3, the other end of the transistor A4 is coupled to the node N4, and the control signal VBLCR is input to the gate of the transistor A4. Namely, the transistor A4 transfers a voltage from the node N3 to the node N4 in accordance with the control signal VBLCR.

One end of the transistor A5 is coupled to the node N4, the other end of the transistor A5 is coupled to a node N5 at the reference electrical potential VSS, and a control signal IREFN is input to the gate of the transistor A5. Namely, the transistor A5 transfers a voltage from the node N4 to the node N5 in accordance with the control signal IREFN. The control signal IREFN is a constant voltage around the threshold voltage of the transistor A5. Therefore, the transistor A5 is always ON (in the state where there is continuity between one end and the other end).

The electrical potential of the node N3 corresponds to the result of comparison between the control signal BLC and the control signal VBLCR as will be described in detail later.

Next, the driver 191B will be described. The driver 191B includes a current source B1, a PMOS transistor B2, and an NMOS transistor B3.

The current source B1 supplies a current IBLC_drv to one end of the transistor B2.

One end of the transistor B2 is coupled to the current source B1, the other end of the transistor B2 is coupled to a node N6 to which the control signal BLC is output, and a control signal GP is input to the gate of the transistor B2.

One end of the transistor B3 is coupled to the node N6, the other end of the transistor B3 is coupled to the node N5, and the control signal IREFN is input to the gate of the transistor B3. The control signal IREFN is a constant voltage around the threshold voltage of the transistor B3. Therefore, the transistor B3 is always ON (in the state where there is continuity between one end and the other end).

Next, the determination circuit 191C will be described. The determination circuit 191C includes PMOS transistors C1, C2, C3, and C4, and NMOS transistors C5, C6, C7, and C8.

One end of the transistor C1 is coupled to the node N1, and a control signal DIS3_ENn (an inversion signal of a control signal DIS3_EN) is input to the gate of the transistor C1.

One end of the transistor C2 is coupled to the node N1, and the control signal DIS3_ENn is input to the gate of the transistor C2.

One end of the transistor C3 is coupled to the other end of the transistor C1, the other end of the transistor C3 is coupled to a node N7 from which a control signal JDG is output, and the control signal GP is input to the gate of the transistor C3. This transistor C3 is used for monitoring the control signal GP.

One end of the transistor C4 is coupled to the other end of the transistor C2, the other end of the transistor C4 is coupled to a node N8 from which a control signal DIS3_ON is output, and the control signal JDG is input to the gate of the transistor C4.

One end of the transistor C5 is coupled to the node N7, and the control signal IREFN is input to the gate of the transistor C5.

One end of the transistor C6 is coupled to the other end of the transistor C5, the other end of the transistor C6 is coupled to the node N5, and the control signal IREFN is input to the gate of the transistor C6.

One end of the transistor C7 is coupled to the node N8, and the control signal IREFN is input to the gate of the transistor C7.

One end of the transistor C8 is coupled to the other end of the transistor C7, the other end of the transistor C8 is coupled to the node N5, and a control signal DIS3_EN is input to the gate of the transistor C8.

The control signal IREFN is a constant voltage around the threshold voltages of the transistors C5 to C7. Therefore, the transistors C5 to C7 are always ON (in the state where there is continuity between one end and the other end).

In the determination circuit 191C, the transistor C3, to which the signal GP is input, is configured to be more easily turned on than the transistor B2 of the driver 191B, and the transistors C5 and C6 are configured to have a higher resistance than the transistor C3. Accordingly, a larger current flows into the transistor C3 than into the transistors C5 and C6. The determination circuit 191C includes the transistors C5 and C6 herein; however, the configuration is not limited to this. The number of transistors to which the control signal IREFN is input through their gates and which provide continuity between the node N7 and the node N5 may be one or three or more as long as the transistors have a higher resistance than the transistor C3. The transistors which provide continuity between the node N7 and the node N5 may have different performances. The transistors C5 and C6 are, but are not limited to, coupled in series, and may be coupled in parallel.

Next, the discharge circuit 191D will be described. The discharge circuit 191D includes NMOS transistors D1 and D2.

One end of the transistor D1 is coupled to the node N6, and the control signal IREFN is input to the gate of the transistor D1.

One end of the transistor D2 is coupled to the other end of the transistor D1, the other end of the transistor D2 is coupled to the node N5, and the control signal DIS3_ON is input to the gate of the transistor D2.

The control signal IREFN is a constant voltage around the threshold voltage of the transistor D1. Therefore, the transistor D1 is always ON (in the state where there is continuity between one end and the other end).

The detailed operation of the BLC driver 191 will be described later.

The circuit configuration of the BLX driver 192 is, for example, the same as that of the BLC driver 191, and descriptions thereof are omitted.

[1-2] Operation

In a read operation, the semiconductor memory device 10 according to the embodiment executes a kick operation. The kick operation is a voltage application method of once setting the drive voltage of the driver at a value higher than the target voltage value, and lowering the voltage to the target voltage value after a given time has elapsed. The kick operation is executed on, for example, the control signals BLX and BLC. For example, when the kick operation is executed on the control signals BLX and BLC, the supply of a current to the bit line BL increases, and the bit line BL is charged. Hereinafter, the voltage higher than the target voltage, which is applied before the target voltage is applied in the kick operation, will be referred to as a kick voltage, and the difference between the target voltage and the kick voltage will be referred to as a kick amount.

Figure 7:
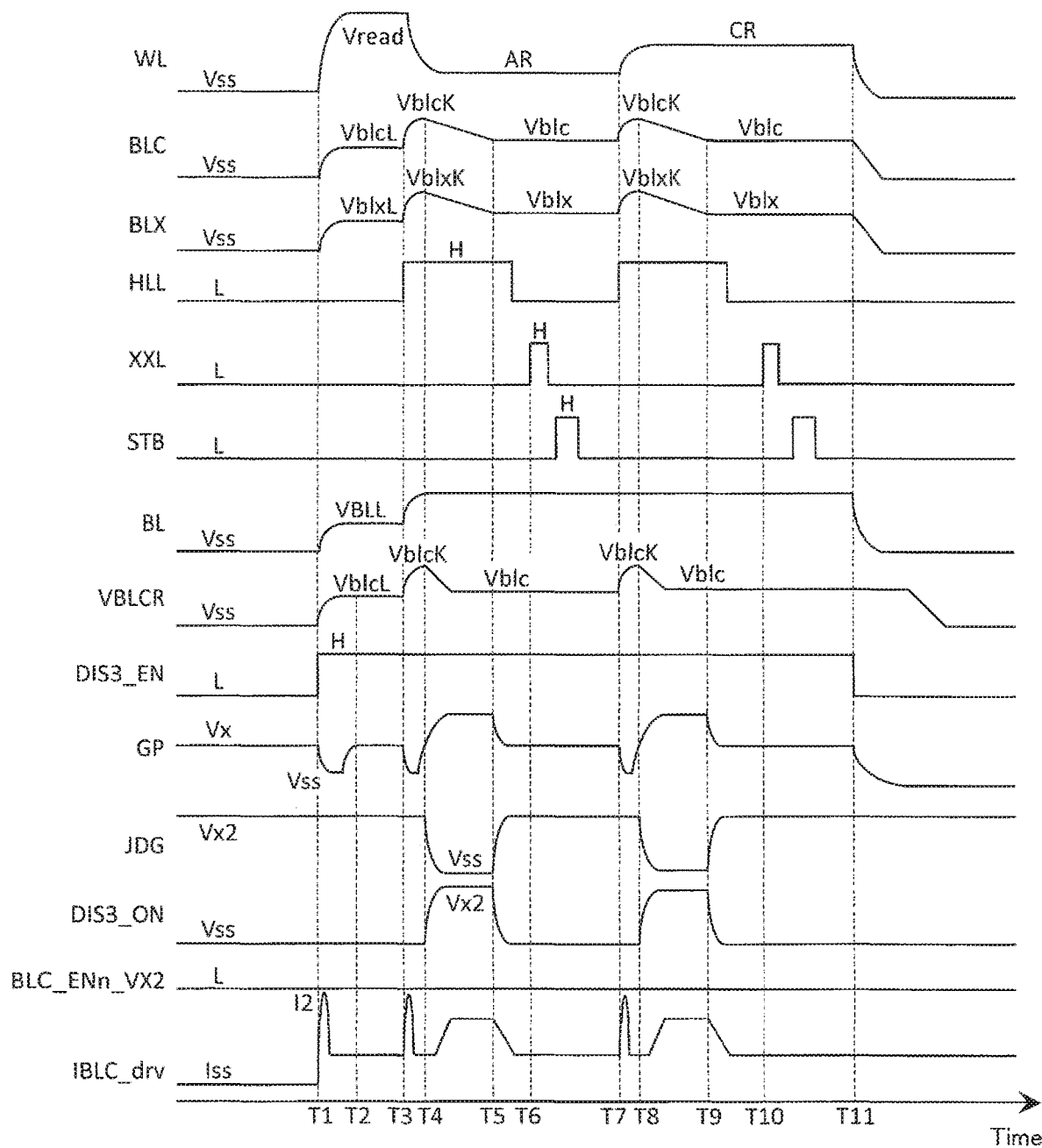
FIG. 7 is a waveform chart of a read operation.

An example of the waveforms in such a read operation of the semiconductor memory device 10 according to the embodiment is shown in FIG. 7. FIG. 7 shows an example of the waveform of the selected word line WL, the waveform of the bit line BL, the waveforms of various control signals, and the waveform of the current IBLC_drv.

In the following description, the NMOS transistors to which various control signals are input are turned on when the H-level voltage is applied to the gate, and are turned off when the L-level voltage is applied to the gate. The PMOS transistors to which various control signals are input are turned on when the L-level voltage is applied to the gate, and are turned off when the H-level voltage is applied to the gate. The memory cell transistors MT belonging to the cell unit CU corresponding to the selected word line WL and the selected string unit SU are called selected memory cells.

As shown in FIG. 7, in the initial state before a time T1, for example, the voltages of the word line WL, bit line BL, control signals BLX, BLC, VBLCR, DIS3_ON are a voltage Vss, the voltage of the control signal GP is a voltage Vx (Vss<Vx), the voltage of the control signal JDG is a voltage Vx2 (VblcL<Vx2), the voltages of the control signals HLL, XXL, STB, DIS3_EN, and BLC_ENn_VX2 are at the L level, and the current IBLC_drv is Iss.

As shown in FIG. 7, when a read operation starts at the time T1, the row decoder module 12 applies, for example, a read pass voltage Vread to the selected word line WL.

The sequencer 17 brings the voltage of the control signal BLX to a voltage VblxL, and brings the voltage of the control signal BLC to a voltage VblcL. Then, the memory cell transistor MT to which the voltage Vread is applied, the transistor 21 to which the voltage VblxL is applied, and the transistor 22 to which the voltage VblcL is applied are turned on. Accordingly, a current is supplied from the sense amplifier module 13 to the bit line BL, and the voltage of the bit line BL rises to a voltage VBLL.

With reference to FIG. 8, the operation of the BLC driver 191 at the time T1 will be described. The operation of the BLX driver 192 may be the same as that of the BLC driver 191, and descriptions thereof will be omitted for simplification.

As shown in FIG. 8, the sequencer 17 raises the electrical potential of the control signal VBLCR to VblcL, thereby turning on the transistor A4. As described above, the transistor A5 is also ON, and the node N3 is electrically coupled to the node N5. As a result, the voltage of the control signal GP is lowered to the voltage Vss.

As shown in FIG. 8, the voltage of the control signal GP is lowered; therefore, the transistor B2 is turned on. As a result, the transistor B2 supplies a current I2 from the current source B1 to the node N6. Therefore, the current IBLC_drv rises from Iss to I2.

Since the transistor B3 is ON as described above, a current I3 flows from the node N6 to the node N5; however, when the current I2 is larger than the current I3, the voltage of the control signal BLC is raised to the voltage VblcL.

When the voltage of the control signal BLC reaches the voltage VblcL, the transistor A3 is turned on, and the electrical potential of the node N2 is lowered. Consequently, the transistors A1 and A2 are turned on. As a result, the electrical potential of the node N3 is raised based on the control signal BLC, and lowered based on the control signal VBLCR. Namely, the electrical potential of the control signal GP corresponds to the result of comparison between the control signal BLC and the control signal VBLCR. When the control signal BLC balances with the control signal VBLCR, the voltage of the control signal GP is the stable voltage Vx.

In addition, at the time T1, the sequencer 17 brings the control signal DIS3_EN to the H level (and brings the control signal DIS3_ENn to the L level). Therefore, the transistors C1 to C3 and C5 to C8 in the determination circuit 191C are turned on, thereby completing the preparation for the determination to control the discharge circuit 191D.

For example, when a current I7 which flows into the transistor C3 is larger than a current I8 which flows into the transistors C5 and C6, the voltage of the control signal JDG is, for example, the voltage Vx2, and the transistor C4 is OFF. Accordingly, the voltage of the control signal DIS3_ON corresponding to the determination result is the voltage Vss, and the transistor D2 is OFF. Namely, when the voltage of the control signal GP is sufficiently low, the determination circuit 191C keeps the voltage of the control signal DIS3_ON at the voltage Vss; consequently, the discharge circuit 191D does not operate.

When the current I7 which flows into the transistor C3 is smaller than the current I8 which flows into the transistors C5 and C6, the voltage of the control signal JDG is, for example, the voltage Vss, and the transistor C4 is ON. Accordingly, the voltage of the control signal DIS3_ON corresponding to the determination result is the voltage Vx2, and the transistor D2 is ON. Namely, when the voltage of the control signal GP is sufficiently high, the determination circuit 191C brings the voltage of the control signal DIS3_ON to the voltage Vx2; consequently, the discharge circuit 191D operates (see times T3-T5 in FIG. 7).

In the determination circuit 191C, the transistor C3 to which the signal GP is input is configured to be more easily turned on than the transistor B2 of the driver 191B, and the transistors into which the current I8 flows (C5 and C6) have a higher resistance than the transistor C3. When the differential amplifier 191A is stable, the voltage of the control signal GP is a voltage that balances with the current I7 and current I8. Accordingly, when the differential amplifier 191A is stable, the transistor C3 is ON, and the control signal JDG is at the H level. Therefore, the control signal DIS3_ON is at the L level, and refrains from operating the discharge circuit 191D.

When the voltage of the control signal GP is higher than the stable voltage (voltage of when VBLCR balances with BLC) Vx, the transistor C3 of the determination circuit 191C is OFF. Accordingly, the transistors C5 and C6 are in a state where charge is extracted from their paths, the control signal JDG is at the L level, and the control signal DIS3_ON is at the H level; consequently, the discharge circuit 191D operates.

Namely, when the voltage of the control signal GP is lower than the voltage Vx, the node N6 is charged by the driver 191B, whereas when the control signal GP is higher than the voltage Vx, the determination circuit 191C makes a determination accordingly, lowers the voltage of the control signal JDG, and discharges the node N6 via the discharge circuit 191D.

As shown in FIG. 7, the sequencer 17 raises the voltage of the control signal VBLCR to the voltage Vblck from the time T3 to the time T4. As a result, the voltage of the control signal VBLCR exceeds the voltage of the control signal BLC, and the voltage of the control signal GP is lowered. Consequently, a current IBLC_drv (I2) is supplied to the node N6, and the voltage of the control signal BLC is raised.

At the time T3, the row decoder module 12 applies, for example, a read voltage AR to the word line WL. The sequencer 17 brings the voltage of the control signal BLX to a voltage Vblxk, and brings the voltage of the control signal BLC to a voltage Vblck, as the kick operation. The voltage Vblxk is higher than the voltage VblxL, and the voltage Vblck is higher than the voltage VblcL. Those voltages Vblxk and Vblck are voltages higher than desired voltages by a voltage BLkick. As the voltage of the gate rises, more current flows into the transistors 21 and 22; therefore, the voltage of the bit line BL rises. Then, the sequencer 17 brings the control signal HLL to the H level. When the control signal HLL is brought to the H level, the transistor 24 is turned on, and the node SEN is charged. When charging of the node SEN is completed, the sequencer 17 brings the control signal HLL to the L level.

At the time T4, the sequencer 17 lowers the voltage of the control signal VBLCR from the voltage Vblck to the voltage Vblc (Vblc<Vblck). As a result, the voltage of the control signal VBLCR becomes lower than the voltage of the control signal BLC, and the voltage of the control signal GP is raised. Consequently, the supply of the current IBLC_drv (I2) to the node N6 is stopped, and the voltage of the control signal BLC is raised. When the voltage of the control signal GP exceeds the voltage Vx, the voltage of the control signal JDG of the determination circuit 191C is lowered, and the voltage of the control signal DIS3_ON to control the discharge circuit 191D is raised. As a result, the discharge circuit 191D discharges the node N6. Therefore, the voltage of the control signal BLC is lowered from the voltage Vblck to the voltage Vblc. At this time, the current IBLC_drv increases.

When the control signal BLC balances with the control signal VBLCR at the time T5, the voltage of the control signal GP reaches the stable voltage, and the voltage of the node N6 is stabilized.

At a time T6, the sequencer 17 brings the control signal XXL to the H level. When the control signal XXL is brought to the H level, the electrical potential of the node SEN changes based on the state of the selected memory cell. After that, the sequencer 17 brings the control signal XXL to the L level to finalize the electrical potential of the node SEN. Then, the sequencer 17 brings the control signal STB to the H level, determines whether the threshold voltage of the selected memory cell is equal to or higher than the voltage AR based on the state of the node SEN, and holds the determination result in a latch circuit in the sense amplifier unit SAU.

At a time T7, the row decoder module 12 applies, for example, a read voltage CR to the word line WL. The sequencer 17, for example, temporarily raises the voltage of the control signal BLX by the voltage BLkick, and temporarily raises the voltage of the control signal BLC by a voltage BLkickh which is larger than the voltage BLkick. The sequencer 17 raises the voltage of the control signal VBLCR to the voltage Vblck. As a result, the voltage of the control signal VBLCR exceeds the voltage of the control signal BLC, and the voltage of the control signal GP is lowered. Consequently, the current IBLC_drv (I2) is supplied to the node N6, and the voltage of the control signal BLC is raised.

The operation of the control signal HLL at the time T7 is the same as that of the control signal HLL at the time T3.

The operation from a time T8 to a time T9 is the same as that from the time T4 to the time T5.

At a time T10, the sequencer 17 brings the control signal XXL to the H level. When the control signal XXL is brought to the H level, the electrical potential of the node SEN changes based on the state of the selected memory cell. After that, the sequencer 17 brings the control signal XXL to the L level to finalize the electrical potential of the node SEN. Then, the sequencer 17 brings the control signal STB to the H level, determines whether the threshold voltage of the selected memory cell is equal to or higher than the voltage CR based on the state of the node SEN, and holds the determination result in a latch circuit in the sense amplifier unit SAU.

At a time T11, the row decoder module 12 and the sequencer 17 bring the word line WL and various control signals back to the initial state, and complete the read operation of the page.

[1-3] Advantages of Embodiment

The semiconductor memory device 10 according to the above-described embodiment can speed up the read operation. Hereinafter, detailed advantages of the semiconductor memory device 10 according to the embodiment will be described.

To explain the detailed advantages of the semiconductor memory device 10, a comparative example will be described.

Figure 9:
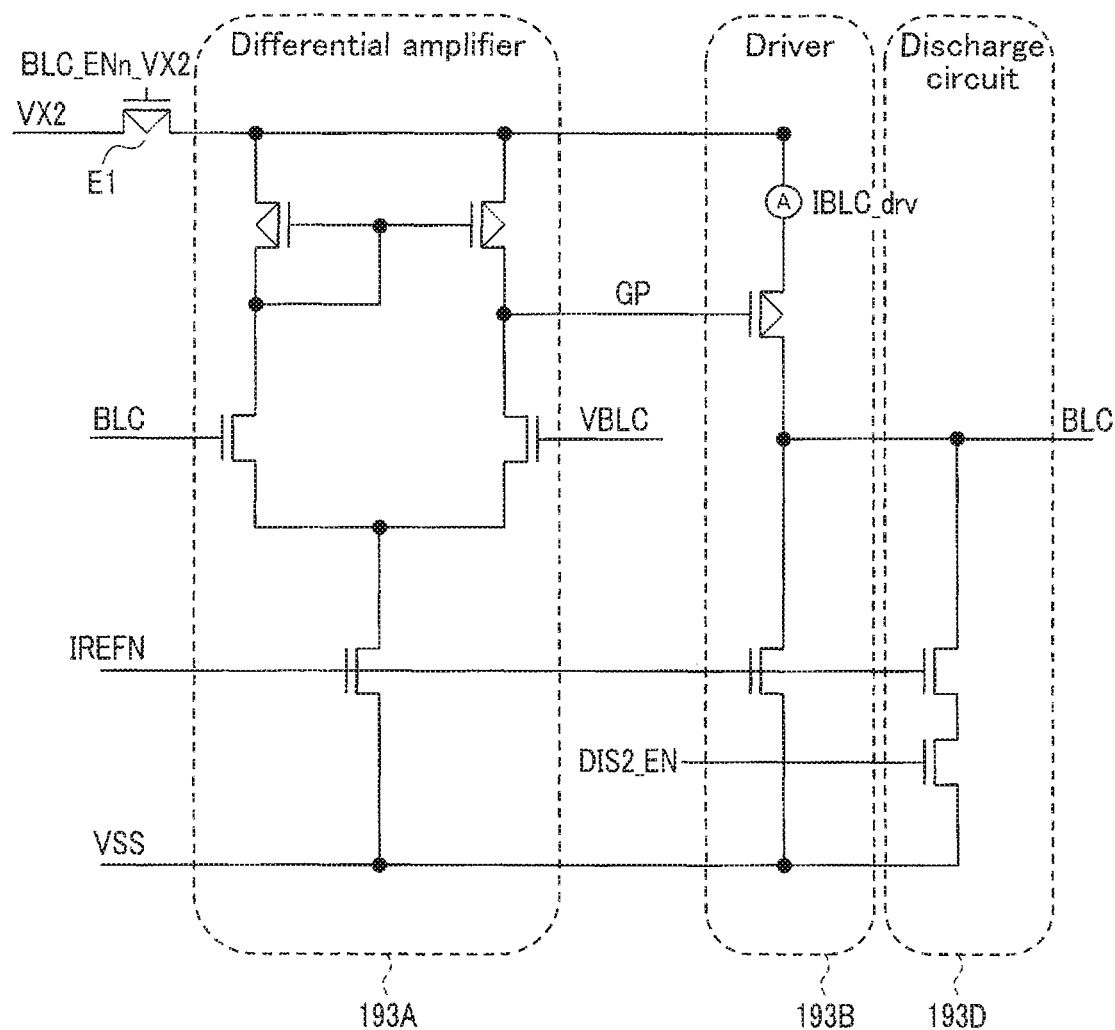
FIG. 9 is a circuit diagram showing a configuration example of a BLC driver according to a comparative example.

As shown in FIG. 9, a BLC driver 193 according to the comparative example does not include the determination circuit 191C of the present embodiment.

When the BLC driver 193 has the configuration as shown in FIG. 9, there may occur three problems or so.

The first problem occurs when, for example, the node of the control signal BLC is discharged without using a discharge circuit 193D. The discharging is performed with a constant current. Therefore, as shown in FIG. 10(a), it takes time to stabilize the control signal BLC.

The second problem occurs when, for example, the node of the control signal BLC is discharged by using the discharge circuit 193D. The control signal BLC is quickly stabilized. However, a current IBLC_drv is large as shown in FIG. 10(b).

The third problem occurs when, for example, the node of the control signal BLC is discharged by using the discharge circuit 193D, and the operation of the discharge circuit 193D is terminated after a given period of time has elapsed. The control signal BLC is quickly stabilized. However, as shown in FIG. 10(c), if the discharge performance is suddenly changed, the voltage becomes unstable, and noise may ride on the control signal BLC. In this case, it is necessary to wait for the noise to become stable, which is a waste of time.

In this way, if the discharge performance is kept high, the current consumption increases, whereas if the discharge performance is not raised, discharging takes time. Furthermore, if the discharge performance is kept high only for a predetermined period of time, the discharge current is switched after stabilization of the control signal BLC, and noise is caused in the control signal BLC due to the responsiveness of the differential amplifier.

The period in which the discharge performance should be kept high varies depending on the parasitic capacitance of the control signal BLC.

According to the above-described embodiment, however, the determination circuit 191C determines "whether or not to discharge the node relating to the control signal BLC" based on the control signal GP, and operates the discharge circuit 191D when the node should be discharged. The determination circuit 191C can automatically determine the time when discharging is required; therefore, even if the load of the output of the differential amplifier 191A varies, the discharge path of the discharge circuit 191D opens to a degree corresponding to the variation of the load. Therefore, as shown in FIG. 10(d), the discharge capacitance of the node relating to the control signal BLC can be raised and the operation can be sped up while holding down the current consumption.

[2] Modifications, Etc.

In the above embodiment, the case where a read operation is executed on all the bit lines BL is described, but the configuration is not limited to this. For example, the semiconductor memory device 10 may have a configuration in which a read operation is separately executed on the odd-number bit lines and the even-number bit lines. In this case, the sense amplifier module 13 is provided, for example, for the odd-number bit lines and for the set of the even-number bit lines. The sense amplifier module 13 for the odd-number bit lines and that for the set of the even-number bit lines are supplied with different control signals BLC. The above-described embodiment can be applied to the semiconductor memory device 10 having such a configuration.

In the above embodiment, a read operation to read upper page data is described as an example; however, the read operation is not limited to this. The operation described in the above embodiment can be applied to a read operation to read lower page data. In the above-described embodiment, the case where 2-bit data is stored in a single memory cell is described as an example; however, the configuration is not limited to this. For example, 1-bit or 3 or more-bit data may be stored in a single memory cell. Even in such a case, the read operation described in the embodiment can be executed.

In the above embodiment, the case where the kick amount to the voltage corresponding to the control signal BLC in the kick operation is approximately constant has been described; however, the configuration is not limited to this. For example, those voltages may be changed based on the address of the word line WL to be selected. Specifically, when the memory cell has a three-dimensionally laminated structure, there is a case where, for example, the RC time constant differs between the upper layer word lines WL and the lower layer word lines WL and, thus, the appropriate kick amount differs therebetween. In such a case, the semiconductor memory device 10 can speed up the read operation by applying an optimized kick amount to the word lines WL of each layer.

In the above embodiment, the case where the semiconductor memory device 10 reads data of each page is described as an example; however, the configuration is not limited to this. For example, the semiconductor memory device 10 may be configured to collectively read multi-bit data stored in the memory cell. Even in such a case, the kick operation may be applied in the voltage application for the read operation; therefore, the semiconductor memory device 10 can apply the operation described in the above embodiment.

In the above embodiment, the read operation is described with reference to the timing chart showing the waveform of the word line WL; however, the waveform of the word line WL is the same as that of the signal line to supply a voltage to the row decoder module 12, for example. Namely, the voltage applied to the word line WL and the period during which a voltage is applied to the word line WL can be roughly ascertained by referring to the voltage of the corresponding signal line. The voltage of the word line WL may be lower than that of the corresponding signal line due to voltage decrease caused by a transistor included in the row decoder module 12.

In the above embodiment, the memory cell array 11 may have a different configuration. That is, the configuration of the memory cell array 11 may be based on that as described in, for example, U.S. patent application Ser. No. 12/407,403, entitled "Three-dimensional Stacked Nonvolatile Semiconductor Memory", filed on Mar. 19, 2009. It may also be based on that as described in U.S. patent application Ser. No. 12/406,524, entitled "THREE-DIMENSIONAL STACKED NONVOLATILE SEMICONDUCTOR MEMORY", filed on Mar. 18, 2009, U.S. patent application Ser. No. 12/679,991, entitled "NONVOLATILE SEMICONDUCTOR MEMORY DEVICE AND MANUFACTURING METHOD THEREOF", filed on Mar. 25, 2010, or U.S. patent application Ser. No. 12/532,030, entitled "SEMICONDUCTOR MEMORY and MANUFACTURING METHOD THEREOF", filed on Mar. 23, 2009. The entire contents of those patent applications are incorporated herein by reference.

In the above embodiment, the case where the block BLK is the data erase unit has been described; however, the configuration is not limited to this. Another erase operation, such as described in U.S. patent application Ser. No. 13/235,389, entitled "NONVOLATILE SEMICONDUCTOR MEMORY DEVICE", filed on Sep. 18, 2011 or U.S. patent application Ser. No. 12/694,690, entitled "NONVOLATILE SEMICONDUCTOR MEMORY DEVICE", filed on Jan. 27, 2010 may be used instead. The entire contents of those patent applications are incorporated herein by reference.

The "coupling" herein refers to electrical coupling, and does not exclude, for example, existence of another element between the coupled elements.

In the above-described embodiment, (1) In the read operation, the voltage applied to a selected word line in an "A"-level read operation is, for example, in the range from 0V to 0.55V. The range of the voltage is not limited to this, and may be any one of the range from 0.1V to 0.24V, the range from 0.21V to 0.31V, the range from 0.31V to 0.4V, the range from 0.4V to 0.5V, or the range from 0.5V to 0.55V.

The voltage applied to a selected word line in a "B"-level read operation is, for example, in the range from 1.5V to 2.3V. The range of the voltage is not limited to this, and may be any one of the range from 1.65V to 1.8V, the range from 1.8V to 1.95V, the range from 1.95V to 2.1V, or the range from 2.1V to 2.3V.

The voltage applied to a selected word line in a "C"-level read operation is, for example, in the range from 3.0V to 4.0V. The range of the voltage is not limited to this, and may be any one of the range from 3.0V to 3.2V, the range from 3.2V to 3.4V, the range from 3.4V to 3.5V, the range from 3.5V to 3.6V, or the range from 3.6V to 4.0V.

The read operation time (tRead) may be, for example, in the range from 25 µs to 38 µs, the range from 38 µs to 70 µs, or the range from 70 µs to 80 µs.

(2) The write operation includes the program operation and the verify operation as described above. The voltage first applied to a selected word line in the program operation is, for example, in the range from 13.7V to 14.3V. The range of the voltage is not limited to this, and may be either the range from 13.7V to 14.0V or the range from 14.0V to 14.6V. The voltage applied to a non-selected word line in the program operation is, for example, in the range from 6.0V to 7.3V. The range of the voltage is not limited to this, and may be the range from 7.3V to 8.4V, or not greater than 6.0V.

In the write operation, the voltage first applied to a selected word line when an odd-numbered word line is selected may differ from the voltage first applied to a selected word line when an even-numbered word line is selected. In the write operation, the applied pass voltage may be changed depending on whether the non-selected word line is an odd-numbered word line or an even-numbered word line.

The step-up width of the program voltage in the case where the program operation is incremental step pulse programming (ISPP) is, for example, 0.5V or so.

The time (tProg) for the write operation may be, for example, in the range from 1700 µs to 1800 µs, the range from 1800 µs to 1900 µs, or the range from 1900 µs to 2000 µs.

(3) In the erase operation, the voltage first applied to a well which is formed in an upper part of the semiconductor substrate and above which the memory cell is provided is, for example, in the range from 12.0V to 13.6V. The range of the voltage is not limited to this, and may be, for example, in the range from 13.6V to 14.8V, the range from 14.8V to 19.0V, the range from 19.0V to 19.8V, or the range from 19.8V to 21.0V.

The erase operation time (tErase) may be, for example, in the range from 3000 µs to 4000 µs, the range from 4000 µs to 5000 µs, or the range from 4000 µs to 9000 µs.

(4) The structure of the memory cell includes a charge accumulation layer provided on the semiconductor substrate (silicon substrate) via a tunnel insulating film having a thickness in the range from 4 to 10 nm. The charge accumulation layer may have a laminated structure of an insulating film of SiN or SiON having a thickness in the range from 2 to 3 nm and polysilicon having a thickness in the range from 3 to 8 nm. The polysilicon may include a metal such as Ru. An insulating film is provided on the charge accumulation layer. This insulating film includes a silicon dioxide film having a thickness in the range from 4 to 10 nm, which is interposed between a lower High-k film having a thickness in the range from 3 to 10 nm and a higher High-k film having a thickness in the range from 4 to 10 nm, for example. The High-k film is, for example, HfO. The thickness of the silicon dioxide film may be greater than that of the High-k film. On the insulating film, a control electrode having a thickness in the range from 30 to 70 nm is formed via a material having a thickness in the range from 3 to 10 nm. The material is, for example, a metal-oxide film such as TaO and a metal-nitride film such as TaN. For example, W may be used for the control electrode. An air gap may be formed between memory cells.

While and embodiment has been described, the embodiment has been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a first memory cell;
   a first word line coupled to the first memory cell;
   a first sense amplifier including a first transistor;
   a first bit line which couples the first memory cell to the first transistor; and
   a first driver configured to supply a first control signal to a gate of the first transistor, the first driver including:
      a first circuit configured to compare the first control signal and a second control signal to generate a third control signal based on a comparison result;
      a second circuit configured to charge and discharge a voltage of a first voltage output node at which the first control signal is generated, based on the third control signal;
      a third circuit configured to generate a fourth control signal indicating whether or not to discharge the voltage of the first voltage output node based on the third control signal; and
      a fourth circuit configured to discharge the voltage of the first voltage output node based on the fourth control signal, wherein
   in a first period to allow the first sense amplifier to determine data stored in the first memory cell while a Read voltage is applied to the first word line during a read operation,
   the first driver brings a voltage of the first control signal from a first voltage to a second voltage which is higher than the first voltage, and then from the second voltage to a third voltage which is lower than the second voltage.

2. The semiconductor memory device according to claim 1, wherein the third circuit causes the fourth circuit to discharge the voltage of the first voltage generation node when a voltage of the third control signal is higher than a fourth voltage, and prevents the fourth circuit from discharging the voltage of the first voltage generation node when the voltage of the third control signal is lower than the fourth voltage.

3. The semiconductor memory device according to claim 1, wherein the third circuit generates a fifth control signal based on the third control signal, and generates the fourth control signal based on the fifth control signal.

4. The semiconductor memory device according to claim 3, wherein the third circuit includes a second transistor configured to charge a voltage of a second voltage generation node at which the fifth control signal is generated, based on the third control signal.

5. The semiconductor memory device according to claim 4, wherein the third circuit includes a first discharger configured to discharge the voltage of the second voltage generation node.

6. The semiconductor memory device according to claim 5, wherein the first discharger includes a third transistor configured to discharge the voltage of the second voltage generation node.

7. The semiconductor memory device according to claim 5, wherein the first discharger includes a fourth transistor and fifth transistor configured to discharge the voltage of the second generation node and coupled in series.

8. The semiconductor memory device according to claim 5, wherein a current that flows into the second transistor is larger than a current that flows into the first discharger.

9. The semiconductor memory device according to claim 4, wherein the third circuit further includes a sixth transistor configured to supply a voltage to the second transistor.

10. The semiconductor memory device according to claim 3, wherein the third circuit includes a seventh transistor configured to charge a voltage of a third voltage generation node at which the fourth control signal is generated, based on the fifth control signal.

11. The semiconductor memory device according to claim 10, wherein the third circuit includes a second discharger configured to discharge the voltage of the third voltage generation node.

12. The semiconductor memory device according to claim 11, wherein the second discharger includes an eighth transistor and ninth transistor configured to discharge the voltage of the third voltage generation node and coupled in series.

13. The semiconductor memory device according to claim 10, wherein the third circuit further includes a tenth transistor configured to supply a voltage to the seventh transistor.

14. The semiconductor memory device according to claim 2, wherein the third circuit generates a fifth control signal based on the third control signal, and generates the fourth control signal based on the fifth control signal.

15. The semiconductor memory device according to claim 14, wherein the third circuit includes a second transistor configured to charge a voltage of a second generation node at which the fifth control signal is generated based on the third control signal.

16. The semiconductor memory device according to claim 15, wherein the third circuit includes a first discharger configured to discharge the voltage of the second generation node.

17. The semiconductor memory device according to claim 16, wherein the first discharger includes a third transistor configured to discharge the voltage of the second voltage generation node.

18. The semiconductor memory device according to claim 16, wherein the first discharger includes a fourth transistor and fifth transistor configured to discharge the voltage of the second voltage generation node and coupled in series.

19. The semiconductor memory device according to claim 16, wherein a current that flows into the second transistor is larger than a current that flows into the first discharger.

20. The semiconductor memory device according to claim 15, wherein the third circuit further includes a sixth transistor configured to supply a voltage to the second transistor.

* * * * *